(12) United States Patent
Kumar et al.

(10) Patent No.: US 8,942,333 B2
(45) Date of Patent: Jan. 27, 2015

(54) APPARATUS AND METHODS FOR CLOCK ALIGNMENT FOR HIGH SPEED INTERFACES

(71) Applicant: Texas Instruments Incorporated, Dallas, TX (US)

(72) Inventors: Arvind Kumar, Kadugodi (IN); Shobhit Singhal, Bangalore (IN); Vikas Lakhanpal, Bengaluru (IN); Kalpesh Amrutlal Shah, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 64 days.

(21) Appl. No.: 13/674,154

(22) Filed: Nov. 12, 2012

(65) Prior Publication Data

US 2014/0133613 A1    May 15, 2014

(51) Int. Cl.
*H04L 7/00*    (2006.01)
*H04L 7/02*    (2006.01)

(52) U.S. Cl.
CPC ....................................... *H04L 7/02* (2013.01)
USPC ............ 375/354; 375/373; 375/375; 375/376

(58) Field of Classification Search
USPC .................................. 375/354, 373, 375, 376
See application file for complete search history.

(56) References Cited

U.S. PATENT DOCUMENTS

2006/0250283 A1* 11/2006 Lin ................................. 341/50

* cited by examiner

*Primary Examiner* — Kabir A Timory
(74) *Attorney, Agent, or Firm* — John R. Pessetto; Frederick J. Telecky, Jr.

(57) ABSTRACT

Apparatuses and methods for phase aligning at least two clocks used by respective first and second circuitry systems, such as a memory controller and a DDR PHY interface in a system on a chip system. A first circuit samples a phase of a first clock used by the first circuitry system, and then a delay circuit selectively delays a second clock used by the second circuitry system and sets a delayed timing of the second clock. To economize resources and reduce chip area, a logic circuit receives the sampled phase of the first clock, determines which delayed timing matches timing of the sampled phase, and sets the delay circuit to a fixed delayed timing corresponding to the delayed timing that matches the sampled phase. Thus, phase alignment of the two clocks is achieved with fewer resources.

6 Claims, 6 Drawing Sheets

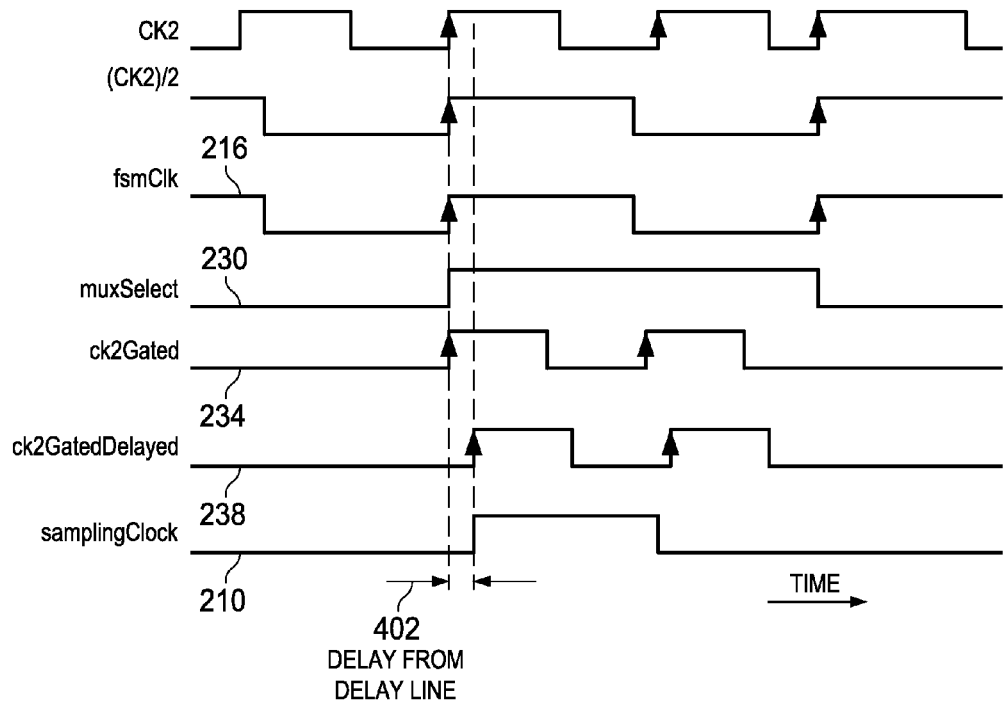
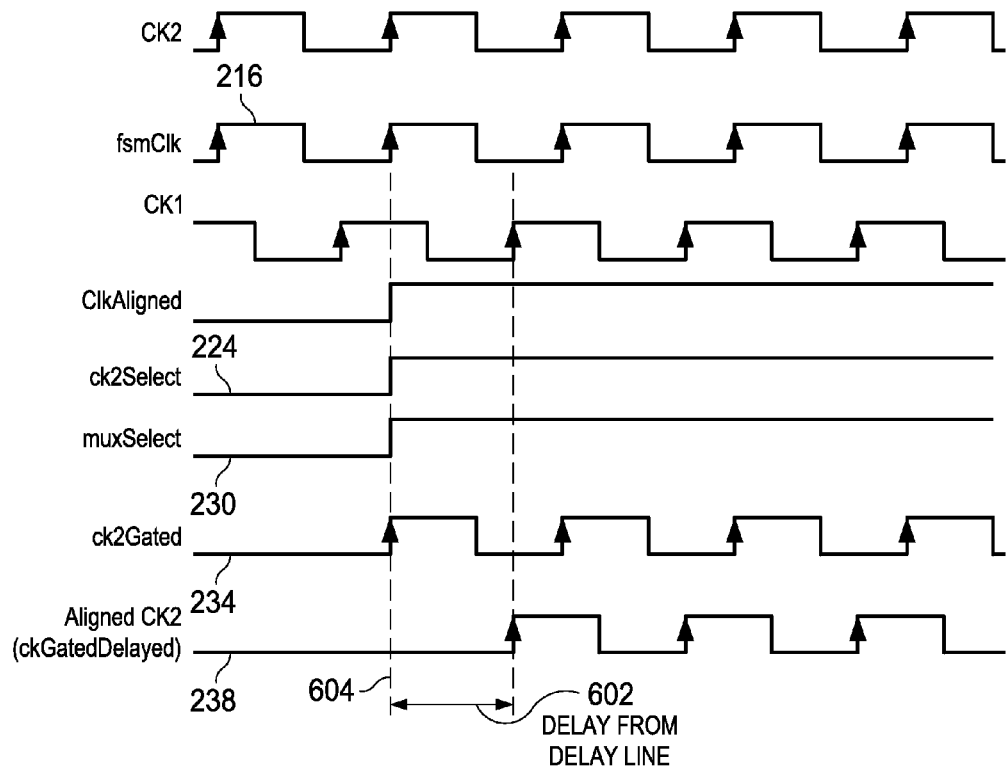

APPARATUS AND METHODS FOR CLOCK ALIGNMENT FOR HIGH SPEED INTERFACES

BACKGROUND

1. Field

The various circuit embodiments described herein relate in general to clock alignment between two clocks used in interfacing circuitry, and, more specifically, to apparatus and method for clock alignment for high speed interfaces.

2. Background

Alignment and matching of clocks serving two circuits that interface with synchronization is an important concern. As illustration of this concern, FIG. 1 shows a clock signal (CLK) from a timing circuit 102 (e.g., a Phase-locked loop (PLL)) that may reach different circuit blocks 104 and 106 at different times. If the two blocks 104 and 106 are interfacing or communicating with each other, data from one block (104) to another block (106) can be asynchronous due to mismatch of clock inputs resultant from different routing path delays. When circuit blocks are operated at lower frequencies, alignment of different clock signals can be accomplished by proper physical design, such as by designing placement and routing of clock signal runs to the circuitry have roughly equivalent transmission times to mitigate signal delays and skew between clock signals arriving at the circuitry. At circuitry operating at higher frequencies where skews are significant with respect to the clock period, however, malfunctioning may occur with disparate clock signals. Moreover, alignment in high speed circuits, such as in System on a Chip packages (SOC's) that run at Gigahertz (Ghz) frequencies, introduces difficult challenges resulting from significant skewing at higher frequencies that are not easily overcome by using a physical design approach to align clock signals.

Other than physical design, another approach to the problem of high speed circuits synchronization is to use Phase-locked loops (PLL's) to attempt to de-skew the clocks. A problem with such an approach, however, is that this solution requires larger size or chip area and consumes more power, which is of particular concern in SOC's, as well as necessitating special requirements in the physical layout of a chip. Additionally, the PLL approach generally does not afford availability to access its accurate functional model or change its functional model.

SUMMARY

According to an aspect, an apparatus for phase aligning at least two clocks used by respective circuitry systems is disclosed. The apparatus includes a first circuit configured to sample at least a phase of a first clock used by a first circuitry system. The apparatus also includes a delay circuit configured to selectively delay a second clock used by a second circuitry system and set one or more delayed timings of the second clock. Furthermore, the apparatus includes a logic circuit configured to receive the sampled phase of the first clock and to determine which one of the plurality of delayed timings matches timing of the sampled phase and to set the delay circuit with the logic circuit to a fixed delayed timing corresponding to the one of the plurality of delayed timings that matches the sampled phase.

According to another aspect of the present disclosure, method for phase aligning at least two clocks used by respective circuitry systems is disclosed. The method includes sampling at least a phase of a first clock used by a first circuitry system; selectively delaying a second clock used by a second circuitry system and setting one or more delayed timings of the second clock. Further, the method includes receiving the sampled phase of the first clock in a logic circuit and determining with the logic circuit which one of the plurality of delayed timings matches timing of the sampled phase. Additionally, the method include setting the delay circuit with the logic circuit to a fixed delayed timing corresponding to the one of the plurality of delayed timings that matches the sampled phase.

According to still another aspect, a clock aligner for aligning first and second clocks is disclosed. The aligner includes a phase detector configured to sample a phase of the first clock. A state machine is also included and configured to receive the phase of the first clock. A delay circuit is included in the aligner and configured to selectively and incrementally delay the second clock under the control of the state machine and output a delayed second clock. Furthermore, the phase detector is configured to sample the first clock upon a rising edge of the delayed second clock, and the state machine is further configured to repeatedly compare the sampled phase of the first clock with the delayed second clock to determine a timing when the delayed second clock matches phase with the first clock, and set final timing of the delayed second clock based on the match determination.

BRIEF DESCRIPTION OF THE DRAWINGS

FIG. 4 illustrates the timing of the various signals used by and within the disclosed clock alignment circuitry in a scenario where divided clocks are used.

FIG. 6 illustrates a timing diagram illustrating the final alignment of all clocks for a second circuitry block with a clock of a first circuitry clock in the example of FIG. 3.

In the various figures of the drawing, like reference numbers are used to denote like or similar parts.

DETAILED DESCRIPTION

The presently disclosed apparatus and methods provide clock alignment for high-speed circuitry that interface, without the need for PLL's, as well as reduced power consumption and space requirements in a chip or SOC. In particular, reduced power consumption and space requirements are achieved by using logic circuitry (or equivalents) to sample a first clock and delay another second clock with delay circuitry to then match the phase or cycles of the two clocks. In a particular aspect, the disclosed clock alignment is useful for a high speed Double Data Rate (DDR) memory interface in high speed SOC's for phase alignment of clocks.

Figure 2:
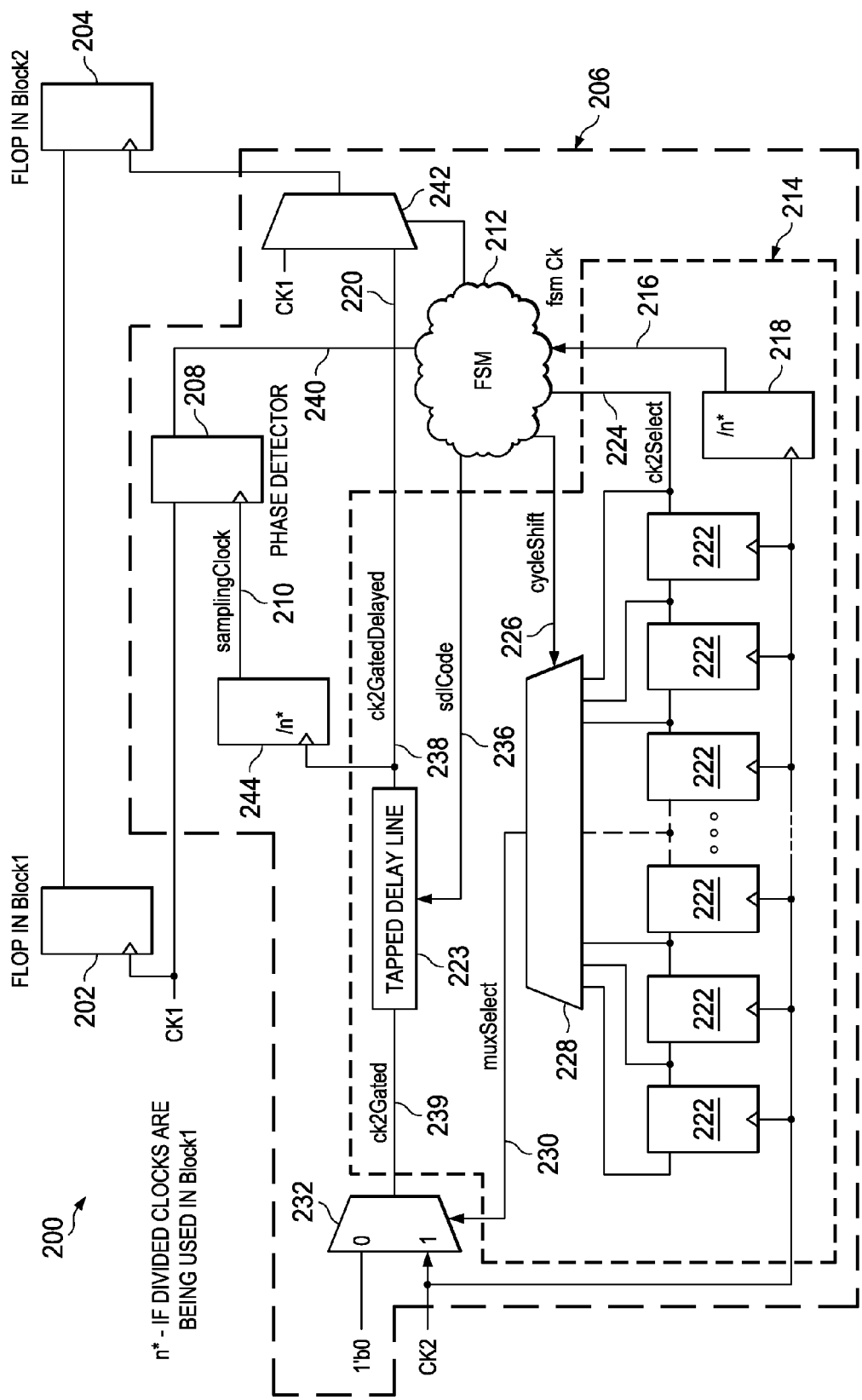
FIG. 2 illustrates an exemplary circuit for aligning two clock signals according to the present disclosure.

FIG. 2 illustrates an architecture 200 including a clock alignment apparatus for aligning a first clock (CK1) used by a first circuitry block 202 with another clock (CK2) used by a second circuitry block 204. In a particular example of a DDR memory interface, first circuitry block 204 could be a Memory Controller and the second circuitry block 204 could be a DDR-PHY. In this architecture, it is assumed that the clock signals reach the DDR-PHY and Memory controller at different times due to different routing lengths, for example, thus giving rise for the need to synchronize the two clock signals. Accordingly, the disclosed clock alignment apparatus 206 is configured to align the second clock CK2 to the first clock CK1, which could be a Memory controller (MC) clock, as well as further ensure that divided clocks, if used with in the second circuitry block 204, are also phase aligned with the first clock CK1.

The clock alignment apparatus 206 includes a phase detector 208 configured to sample the first clock CK1 for determining the phase timing of the clock cycle of CK1. Detector 208 may be implemented with a flip flop triggered on the rising edge (e.g., a delay flip flop) of a varied input signal (herein denoted as "samplingClock" signal 210) based on a variably delayed signal based on the second clock signal CK2, which will be discussed more fully later.

The sampling of the first clock CK1 is input to a finite state machine (FSM) 212 (or an equivalent logic or processor) that, in part, serves to control a delay circuit 214 that variably delays the timing or phase of the second clock CK2. FSM 212 receives an input 216 of the second clock CK2 (or a division thereof by some factor "n" effected by an optional divider 218 if divided clocks are being used in the first circuitry block 202) denoted "fsmClk" in which to compare against the sampled first clock CK1. FSM 212 outputs a number of control signals (to be discussed later) to the delay circuitry 214 that serve, in particular, to control the delay of clock CK2 based on the sampled CK1 in order to match or align the phase of output gated delayed clock of CK2 220 that is ultimately used by the second circuitry block 204 once alignment is achieved.

In an embodiment, delay circuitry 214 includes a plurality of flip flops 222 (or equivalent device) that are configured to incrementally delay clock CK2 input to each flop 222, and a tapped delay line 223 configured to incrementally introduce delay to an input clock signal. In an aspect, delay of clock CK2 in accomplished by the delay line 223 when the necessary delay that needs to be introduced is less than a source clock cycle (e.g., the cycle of CK2). In the case where the delay to be introduced is greater than a source clock cycle, the additional delay is introduced by the plurality of flops 222.

Delay by flops 222 is accomplished, in part, with a selection or gating signal 224 generated by FSM 212 and also denoted as "ck2Select" to select a desired shift number of flops (222) to gate to a multiplexer 228. A cycle shift signal 226 from FSM 212 to multiplexer 228 is used to initiate a select signal or pulse 230 denoted as "mux Select" from mux 228 to a gating mux 232 that gates input clock CK2 to output a gated version 234 of CK2 denoted as "ck2Gated" while the muxSelect state for selecting the CK2 input is asserted (e.g., a high or "1").

The ck2Gated signal is then input to the tapped delay line 223 that delays the signal based on an input 236 from the FSM 212. In particular, the signal 236 may be consist of a code or value, denoted herein as "sdlCode" that sets the delay line 223 to a particular time delay. The output of line 223 is a delayed CK2 signal 238 (denoted herein as "ck2GatedDelayed") that ultimately is output via a selection multiplexer 242 to the second circuitry block 204. It is noted that in the disclosed example, multiplexer 242 selects between the delayed CK2 signal 238 (or 220) from the apparatus or simply clock CK1 to completely bypass the rest of the apparatus. It is also noted that, in an aspect, the apparatus may not include multiplexer 242 if no need exist for bypassing the disclosed apparatus. However, prior to use of the delayed clock signal 238 for block 204, the FSM 212 advances the timing of the delay line 223 (and the cycle shift from flops 222 in the case of delay needing to be greater than the source clock cycle) until the phase detector output 240 as triggered by the ck2GatedDelayed signal 238 (or through an optional divider 244 when divided clocks are being used) matches the phase of the delayed clock signal 238.

In operation, the clock alignment circuitry 206 serves to align CK2 with CK1 by allowing the clock CK2 to be gated by multiplexer 232 through control of the muxSelect signal or pulse 230. By advancing the time delay of CK2 with delay line 223, the ck2GatedDelayed signal triggers the sampling clock 210 for phase detector 208 at increasing time intervals until the FSM 212 detects matching or alignment of the timing of clocks CK1 and ck2GatedDelayed 238. At that point, the mux 232 can be set such that CK2 is passed to the delay line 223 permanently and mux 242 passes the delayed clock signal 238 to the second circuitry block 204.

Figure 1:
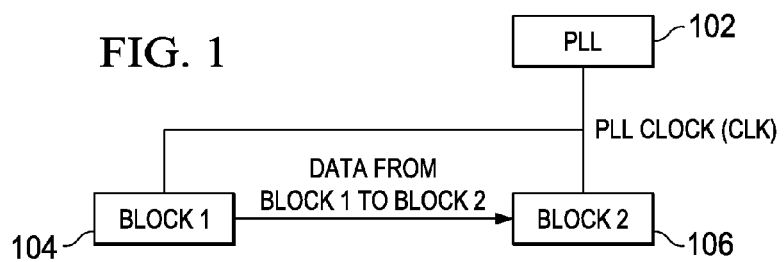
FIG. 1 illustrates an example of communicating circuit blocks in a system that are synchronized by one or more clock signals.
Figure 3:
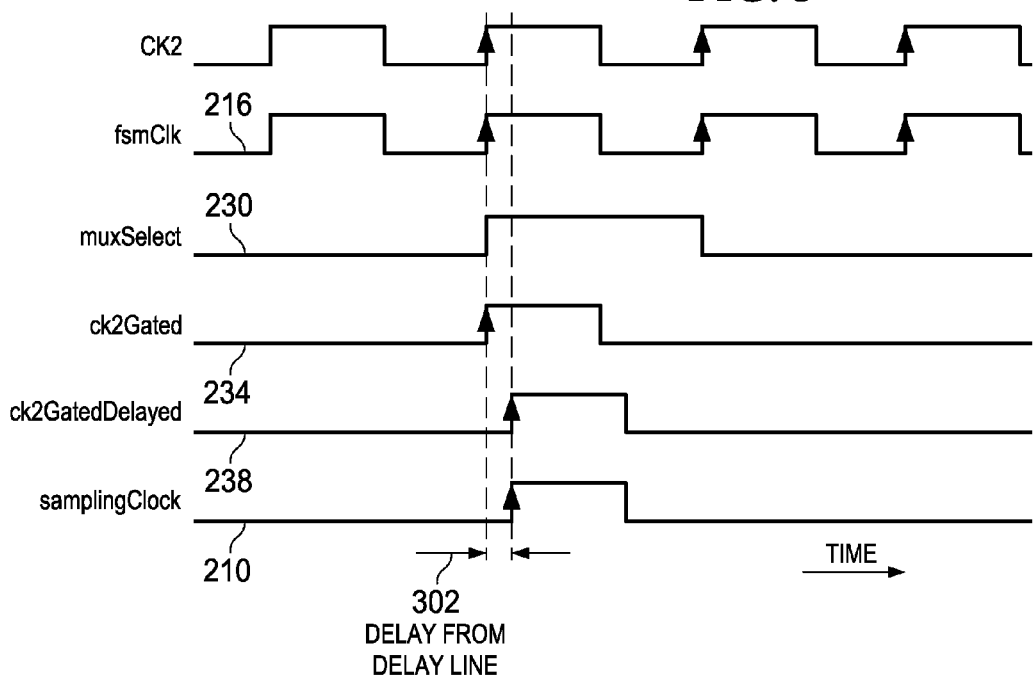
FIG. 3 illustrates the timing of the various signals used by and within the disclosed clock alignment circuitry in a scenario where no divided clocks are used.

FIG. 3 provides an illustration of the timing of the various signals used by and within the clock alignment circuitry 206 for a scenario where no divided clocks are used by block 204. In this case, the input clock signal CK2 and the fsmClk 216 to FSM 212 are the same as illustrated. The muxSelect pulse 230 is sent upon a rising edge of the fsmClk signal 216 and continues in a high state for a full cycle of the fsmClk 216.

While the muxSelect pulse 230 is high, mux 232 passes or gates CK2 to output ck2Gated 234 to delay line 223. Delay line 223 delays the clock 234 by some amount shown at 302 based on the particular input code or signal 236 from FSM 212 and outputs ck2GatedDelayed 234 as illustrated. Accordingly, the sampling clock 210 is the same as signal 234 as no divided clocks are assumed for this scenario (and thus flop 244 is not needed). Based on this cycle illustrated in FIG. 3 and repetitions thereof advancing the code 236 to advance the delay line 223, the FSM 212 may analyze the detected clock CK1 timing to find the rising edge of CK1, and ultimately to match the delayed CK2 clock 238 timing to align with CK1.

FIG. 4 illustrates another scenario of the timing of the various signals used by and within the clock alignment circuitry 206 for a scenario where divided clocks are used by block 202. In this particular illustrated case, it is assumed that block 202 is working on half the frequency of CK1 and block 204 is working on the same frequency of CK2 as well as half the frequency of CK2 as well. Accordingly, the fsmClk 216 is divided by value n=2 (i.e., CK2/2) by flop 218 such that the fsmClk 216 has a period twice as long as that of clock CK2. In this case, fsmClk 216 has a longer period equal to that of CK2/2. The muxSelect pulse 230 is sent upon a rising edge of the fsmClk signal 216 and continues in a high state for a full cycle of the fsmClk 216, which is equal to two cycles of CK2 as may be seen in FIG. 4.

While the muxSelect pulse 230 is high, mux 232 passes or gates CK2 to output ck2Gated 234 to delay line 223. In this scenario, signal 234 will consist of two cycles of CK2. Delay line 223 delays the gated clock signal 234 by some amount shown at 402 based on the particular input code or signal 236 from FSM 212 and outputs ck2GatedDelayed 234 as illustrated. Sampling clock 210 is divided by "n" having a value of 2 such that the sampling clock pulse 210 is equal to a full half cycle of the divided clock CK2/2 and fsmClk 216. Based on this cycle illustrated in FIG. 4 and repetitions thereof advancing the code 236 to advance the delay line 223, the FSM 212 may analyze the detected divided clock timing of clock CK1 to find the rising edge of CK1, and ultimately to match the delayed CK2 clock 238 timing to align with a rising edge of a divided clock of clock CK1.

Figure 5:
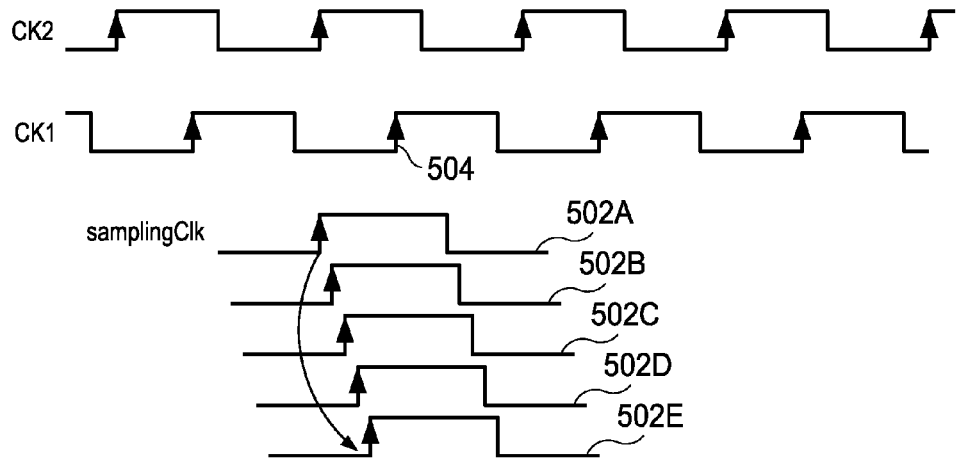
FIG. 5 illustrates an example of timing relationships between CK1, CK2, and the advancement of a sampling clock pulse according to the present disclosure.

FIG. 5 illustrates an example of the timing relationships between CK1, CK2, and the advancement of sampling clock pulse 210. As shown, the sampling pulse 502 (which corresponds to 210 in FIG. 2) is used to sample clock CK1 with the phase detector 208. The gated clock ck2GatedDelayed 238 clock is shifted in fine steps of the tapped delay line 223 as illustrated by samplingClk pulses 502a through 502e. The shifting continues until a low to high transition in CK1 occurs as may be seen at time 504 (i.e., a rising edge of CK1). Although not shown, half cycle shifts, for example, may be effected using flop 222 delay in CK2 path. When rising edge of CK1 is found or detected, such as by FSM 212, the mux gate 232 is opened forever, as the resultant output 238 of the delay line 223 is a phase aligned CK2 clock signal (and (CK2)/2 in a divided by half clock) with clock signal CK1.

FIG. 6 illustrates a timing diagram illustrating the final alignment of all clocks for the second circuitry block 204 with clock CK1 of the first circuitry clock 202 in the example of the scenario in FIG. 3 discussed previously. As illustrated, when the ck2GatedDelayed clock 238 has a sufficient delay time resultant from the past advancement of delay line 223 such that the rising edge of signal 238 is aligned with the rising edge of CK1 as determined through sampling, the delay of line 223 can be fixed. The time of alignment between the delayed CK2 (238) and CK1 is shown at time 604. Additionally, the ck2Select signal 224 and muxSelect signal 230 remain high such that aligned signal 238 is constantly supplied to block 204. It is noted that the clkAligned signal shown in FIG. 6 goes high when alignment is completed and respective code and cycleShift values are stored by the FSM 212. This value is then permanently supplied to the aligner apparatus of FIG. 2 and the muxSelect signal 230 becomes permanently high, thus providing free and continuous running of the aligned clock(s)).

Figure 7:
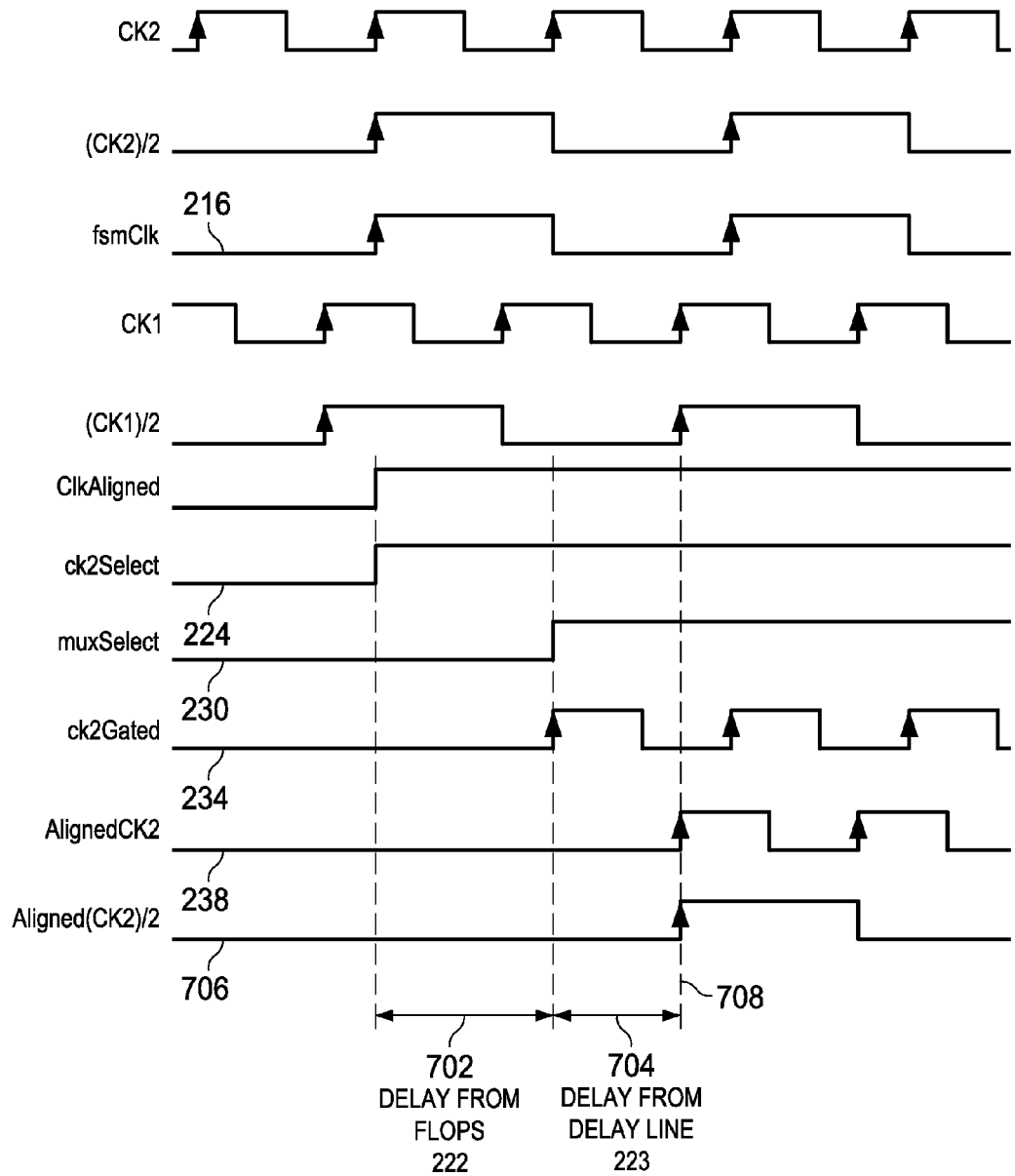
FIG. 7 illustrates a timing diagram illustrating the final alignment of all clocks for a second circuitry block with a clock of a first circuitry clock in the example of FIG. 4.

FIG. 7 illustrates a timing diagram illustrating the final alignment of all clocks for the second circuitry block 204 with clock CK1 of the first circuitry clock 202 in the example of the scenario in FIG. 4 discussed previously. As illustrated, when the ck2GatedDelayed clock 238 has a sufficient delay time introduced by a combination of a time delay introduced by the flops 222 (e.g., a half cycle delay of CK2/2 as shown by 702) and a time delay introduced by the delay line 223 as shown by time 704 such that the rising edges of signals 238 and CK2/2 706 are aligned with a rising edge of CK1, the delay of line 223 can be fixed. Alignment between CK1 and signals 238 and 706 may be seen at time 708, for example. As also shown, the ck2Select signal 224 and muxSelect signal 230 remain high after alignment such that aligned clock signal 238, as well as divided clock signal CK2/2 are constantly supplied to block 204.

Figure 8:
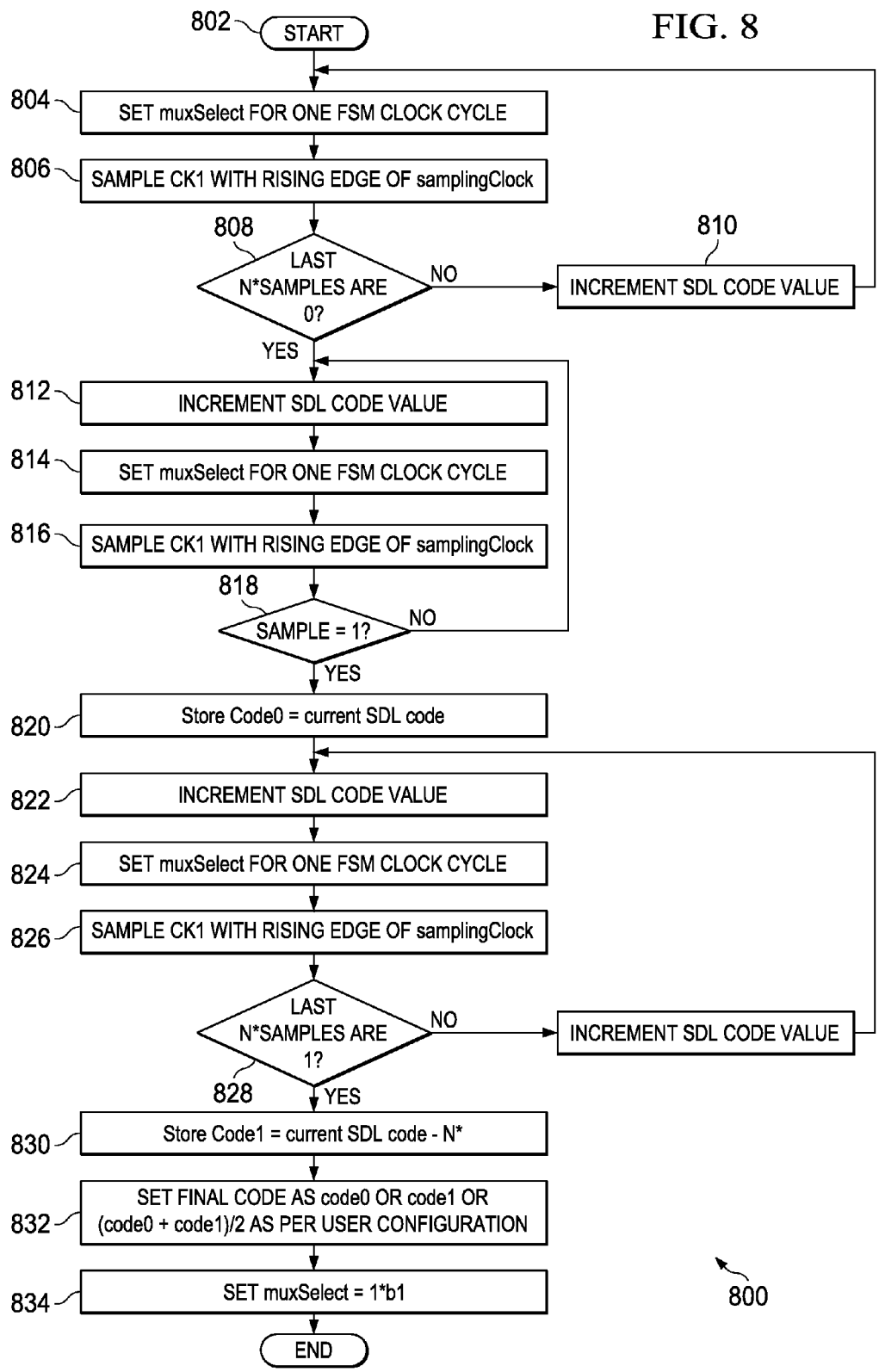
FIG. 8 illustrates an exemplary method for operating the disclosed clock aligner when two circuitry blocks communicate with each other.

FIG. 8 illustrates a method for the alignment of clock between two blocks when they are communicating with other. For example, block 202 would constitute a memory controller and block 204 the DDR PHY. Method 800 may be used to ensure that the clock(s) of block 2, (e.g., CK2 and its divided clocks) are aligned with the clock of block 1, CK1, at which data is launched. Method 800 starts at block 802 and proceeds to block 804 where FSM 212, for example, may set muxSelect signal or pulse 230 for one cycle of clock fsmCk 216. Clock CK1 is then sampled with phase detector 208 upon the rising edge of sampling clock 210 as shown in block 806. After sampling in block 806, a determination is made in decision block 808 whether at least "N" number of samples of the Clock CK1 are "0". The value "N" is user configurable and should be set to a number of stable samples that are required to ensure that sampling has occurred during a time outside the setup/hold windows (i.e., continuous time of $t_{Setup}+t_{Hold}$).

If at block 808, the last "N" number of samples is not "0", then flow proceeds to block 810 where the sdlCode value in FSM 212 is incremented by a predetermined value to correspondingly delay the timing of tapped delay line 223 as the sdlCode value 236 is used to increment the delay of line 223 as illustrated in FIG. 2. Alternatively, if the last "N" number of data or data strobe samples were "0", then flow proceeds to block 812 where the sdlCode value is again incremented.

At block 814, the muxSelect signal or pulse is again set equal one cycle of clock fsmCk 216. The clock CK1 is then sampled at block 816 with the rising edge of the sampling clock 210, which is affected by the ck2GatedDelayed signal 238, in turn affected by sdlCode value 236. Flow then proceeds to decision block 818 where a determination is made whether the sample of clock CK1 is equal to "1" indicating the start of the setup window. If not, flow proceeds back to block 812 where the sdlCode value is again incremented to advance the delay timing of delayed clock CK2.

Figure 9:
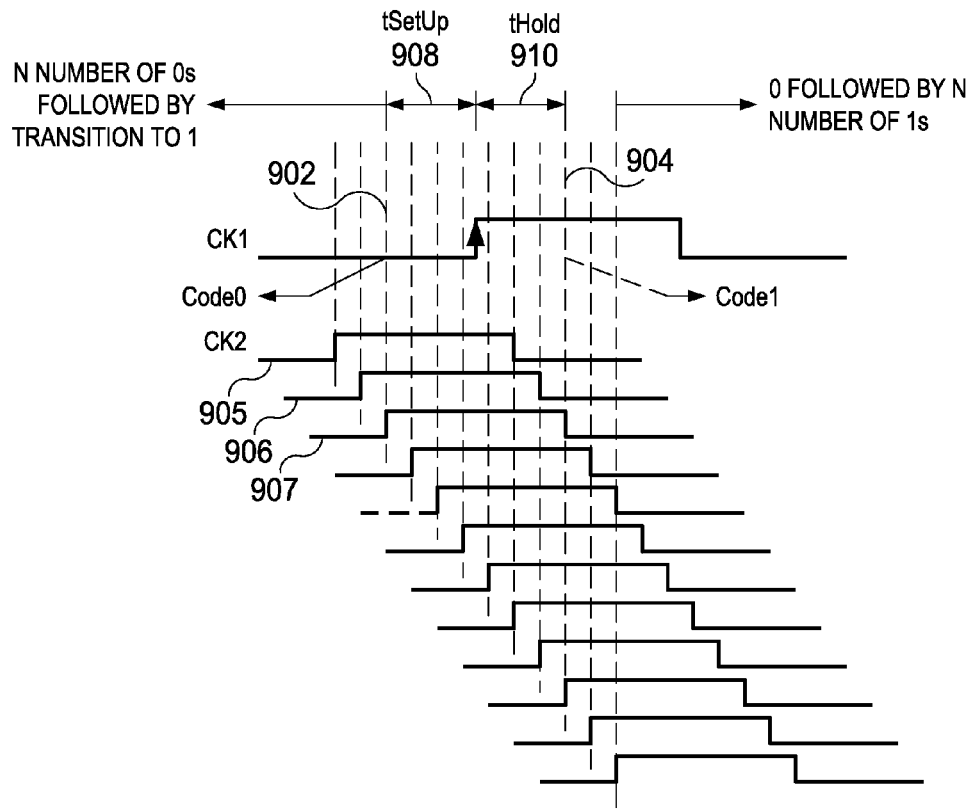
FIG. 9 illustrates a timing diagram illustrating the setting of codes for marking setup and hold windows according the method of FIG. 8

Alternatively at block 818, if the sample equals "1" then flow proceeds to block 820 where a first value denoted as "Code0" is set to current sdlCode value to mark the timing of the start of the setup window. FIG. 9 illustrates a timing diagram showing determination the start of timing of the setup window (i.e., Code0) as well as the end of the hold window. As illustrated a transition of the data occurs at time 902. The Code0 value is determined after the advance of the sdlCode values (see blocks 810 and 812 of FIG. 8) that result in delay advancements of CK2 as illustrated by plots 905, 906, and 907. In this example, after advancement to 907, this corresponds to time 902 (i.e., the start of the setup window 908).

Turning back to FIG. 8, after block 820, the method 800 proceeds to block 822 where the sdlCode value is again incremented. The muxSelect is then set of one cycle of fsmCk 216 as shown by block 824. The clock CK1 is then sampled with the rising edge of sampling clock 210 by phase detector 208, and flow then proceeds to decision block 828. At 828, a determination is made whether the last "N" number of samples is equal to the value "1", again to ensure an adequate number of stable samples for valid data. If not, flow proceeds back to block 822 and the sdlCode value is incremented, with an attendant advance of the CK2 delay as may be seen in FIG. 9.

After an "N" number of Samples are equal to "1" as determined at 828, flow proceeds to block 830 where a value "Code1" is set to the current sdlCode value less the predetermined sample size N. In an aspect, this process is determining the width of the hold window for the phase detector flop. When transition of a D input occurs in the setup and hold window with respect to the sampling clock, violations will tend to occur and the output therefore cannot be predicted. After a zero to one (0>1) transition of the D input, however, when stable 1's values are output, at such time one can ensures that the hold window is finished. By taking an N number of samples, this ensures that the hold window has been surpassed by at least N number of steps of the delay line, even though the actual end of hold window is N steps earlier.

Thus, the Code1 value marks a delay timing value for sdlCode 236 corresponding to the end of the tHold period 910 as illustrated at time 904 in FIG. 9.

Figure 10:
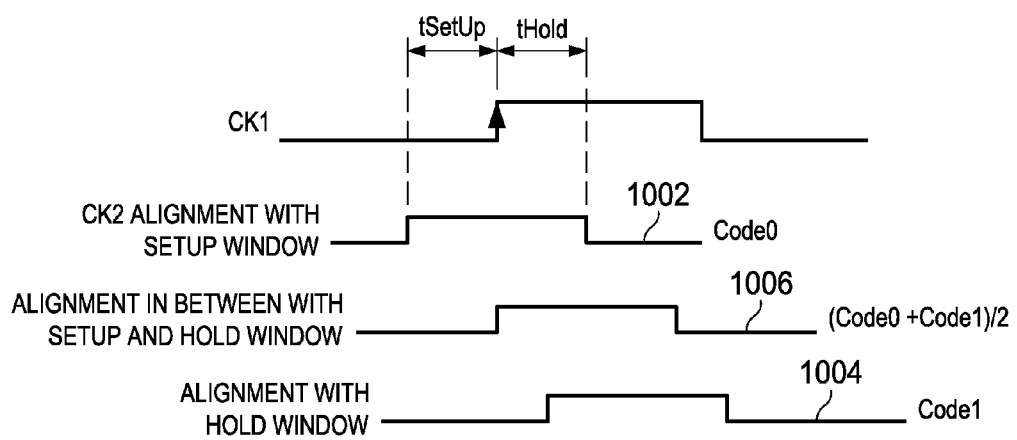
FIG. 10 illustrates timing diagrams for optional settings of the delayed CK2 signal according to the method of FIG. 8.

Flow then proceeds to block 832 where the sdlCode 236 setting the timing delay of timing delay line 223 is determined. In one example, the final sdlCode 236 may be set to Code0 if it is desirable to synchronize clock CK2 with the start of the set up window as indicated by plot 1002 in FIG. 10. In another example, the final sdlCode 236 may be set to Code1 if it is desirable to synchronize clock CK2 with the end of the hold window as indicated by plot 1004 in FIG. 10. Finally, assuming that the timing of the rising edge of CK1 corresponds to the time between the set up window and the hold window, and $t_{setup} = t_{Hold}$, then the final value of sdlCode 236 may be set to half of the total time of the set and hold windows (i.e., $t_{setup} + t_{Hold}/2$ or (Code0+Code1/2)) as illustrated by plot 1006 in FIG. 10. After the final sdlCode 236 is set (i.e., the final delay of CK2 is set), flow proceeds to block 834 where the mux 232 is set to permanently input CK2, and the method 800 ends. It is noted that code0 and code1 are a combination of both sdlCode (236) and cycleShift (226). Thus, it is noted in an aspect that one (1) cycleShift=(A Clock Period of CK2)/(a step size of the delayline)sdlCode Value. Arithmetic operations on these codes are performed accordingly to calculate the final sdlCode value and cycleShift value as per the user configuration.

Electrical connections, couplings, and connections have been described with respect to various devices or elements. The connections and couplings may be direct or indirect. A connection between a first and second electrical device may be a direct electrical connection or may be an indirect electrical connection. An indirect electrical connection may include interposed elements that may process the signals from the first electrical device to the second electrical device.

Although the invention has been described and illustrated with a certain degree of particularity, it should be understood that the present disclosure has been made by way of example only, and that numerous changes in the combination and arrangement of parts may be resorted to without departing from the spirit and scope of the invention, as hereinafter claimed.

The invention claimed is:

1. An apparatus for phase aligning at least two clocks used by respective circuitry systems, the apparatus comprising:
   a first circuit configured to sample at least a phase of a first clock used by a first circuitry system;
   a delay circuit configured to selectively delay a second clock used by a second circuitry system and set one or more of a plurality of delayed timings of the second clock; and
   a logic circuit configured to receive the sampled phase of the first clock and to determine which one of the plurality of delayed timings matches timing of the sampled phase and to set the delay circuit with the logic circuit to a fixed delayed timing corresponding to the one of the plurality of delayed timings that matches the sampled phase;
   wherein the delay circuit comprises a tapped delay line configurable to incrementally delay the second clock based on a code input from the logic circuit; and
   wherein the code input is determined by the logic circuit based on a comparison of the phase of the sampled first clock and a phase of the delayed second clock output from the tapped delay line.

2. An apparatus for phase aligning at least two clocks used by respective circuitry systems, the apparatus comprising:
   a first circuit configured to sample at least a phase of a first clock used by a first circuitry system;
   a delay circuit configured to selectively delay a second clock used by a second circuitry system and set one or more of a plurality of delayed timings of the second clock; and
   a logic circuit configured to receive the sampled phase of the first clock and to determine which one of the plurality of delayed timings matches timing of the sampled phase and to set the delay circuit with the logic circuit to a fixed delayed timing corresponding to the one of the plurality of delayed timings that matches the sampled phase;
   wherein the delay circuit comprises a tapped delay line configurable to incrementally delay the second clock based on a code input from the logic circuit;
   wherein the first circuitry system comprises a memory controller and the second circuitry system comprises a memory physical interface; and
   further comprising:
      determining at least one of a first delay line value for the code input corresponding to a start of a phase detector set up window, a second delay line value for the code input corresponding to an end of a hold window, and a third delay value for the code input corresponding to the difference between the first and second delay line values.

3. An apparatus for phase aligning at least two clocks used by respective circuitry systems, the apparatus comprising:
   a first circuit configured to sample at least a phase of a first clock used by a first circuitry system;
   a delay circuit configured to selectively delay a second clock used by a second circuitry system and set one or more of a plurality of delayed timings of the second clock; and
   a logic circuit configured to receive the sampled phase of the first clock and to determine which one of the plurality of delayed timings matches timing of the sampled phase and to set the delay circuit with the logic circuit to a fixed delayed timing corresponding to the one of the plurality of delayed timings that matches the sampled phase; and
   further comprising:
      clock division circuitry configured to divide the second clock by a predetermined value to produce to divided second clock; and
      selecting a period for gating input of the second clock to the delay circuit based on timing of the divided second clock.

4. A method for phase aligning at least two clocks used by respective circuitry systems, the method comprising:
   sampling at least a phase of a first clock used by a first circuitry system;
   selectively delaying a second clock used by a second circuitry system and setting one or more delayed timings of the second clock;
   receiving the sampled phase of the first clock in a logic circuit and determining with the logic circuit which one of the plurality of delayed timings matches timing of the sampled phase; and
   setting the delay circuit with the logic circuit to a fixed delayed timing corresponding to the one of the plurality of delayed timings that matches the sampled phase;
   wherein delaying the second clock with a tapped delay line configurable to incrementally delay the second clock based on a code input from the logic circuit; and
   wherein the code input is determined by the logic circuit based on a comparison of the phase of the sampled first clock and a phase of the delayed second clock output from the tapped delay line.

5. A method for phase aligning at least two clocks used by respective circuitry systems, the method comprising:

sampling at least a phase of a first clock used by a first circuitry system;

selectively delaying a second clock used by a second circuitry system and setting one or more delayed timings of the second clock;

receiving the sampled phase of the first clock in a logic circuit and determining with the logic circuit which one of the plurality of delayed timings matches timing of the sampled phase; and setting the delay circuit with the logic circuit to a fixed delayed timing corresponding to the one of the plurality of delayed timings that matches the sampled phase;

wherein delaying the second clock with a tapped delay line configurable to incrementally delay the second clock based on a code input from the logic circuit;

wherein the first circuitry system comprises a memory controller and the second circuitry system comprises a memory physical interface; and further comprising:

determining at least one of a first delay line value for the code input corresponding to a start of a phase detector set up window, a second delay line value for the code input corresponding to an end of a hold window, and a third delay value for the code input corresponding to the difference between the first and second delay line values.

6. The method of claim 5 further comprising:

dividing the second clock by a predetermined value to produce the divided second clock; and selecting a period for gating input of the second clock to a delay circuit to delay the second clock based on timing of the divided second clock.

* * * * *